United States Patent [19]
Koh

[11] Patent Number: 5,371,028
[45] Date of Patent: Dec. 6, 1994

[54] METHOD FOR MAKING SINGLE TRANSISTOR NON-VOLATILE ELECTRICALLY ALTERABLE SEMICONDUCTOR MEMORY DEVICE

[75] Inventor: Michael Koh, Singapore, Singapore

[73] Assignee: Chartered Semiconductor Manufacturing Pte Ltd., Singapore, Singapore

[21] Appl. No.: 100,423

[22] Filed: Aug. 2, 1993

[51] Int. Cl.$^5$ .......................................... H01L 21/285
[52] U.S. Cl. ...................... 437/43; 437/978; 437/235; 437/243; 257/321
[58] Field of Search ............... 437/43, 978, 920, 235, 437/243; 148/DIG. 156; 257/321

[56] References Cited

U.S. PATENT DOCUMENTS

| | | | |
|---|---|---|---|
| 5,067,108 | 11/1991 | Jenq | 365/185 |
| 5,104,819 | 4/1992 | Freiberger et al. | 437/978 |
| 5,198,392 | 3/1993 | Fukuda et al. | 437/978 |
| 5,225,361 | 7/1993 | Kakiuchi et al. | 437/43 |

FOREIGN PATENT DOCUMENTS 1134936A  5/1989  Japan ................................. 437/43

OTHER PUBLICATIONS

Wolf and Tauber, "Silicon Processing for the VLSI Era, vol. I: Process Technology", pp. 211–215, 1986.

*Primary Examiner*—Olik Chaudhuri
*Assistant Examiner*—Richard A. Booth
*Attorney, Agent, or Firm*—George O. Saile; Wolmar J. Stoffel

[57] ABSTRACT

An improved electrically programmable and erasable memory device having a plurality of addressable single transistor cells, each transistor having spaced source and drain regions, a floating gate and a control gate. The improvement is a new tunneling insulator layer structure between the floating gate and the control gate. The improved tunneling layer is a dual layer formed of a outer silicon oxide layer and an inner silicon oxynitride layer.

8 Claims, 3 Drawing Sheets

METHOD FOR MAKING SINGLE TRANSISTOR NON-VOLATILE ELECTRICALLY ALTERABLE SEMICONDUCTOR MEMORY DEVICE

BACKGROUND OF THE INVENTION (1) Field of the Invention

The present invention relates to single transistor electrically programmable and erasable memory devices.

(2) Description of the Prior Art

U.S. Pat. No. 5067108 discloses an electrically programmable and erasable memory device wherein each cell has a single transistor provided with a floating gate of polycrystalline silicon and a control gate located over a channel region defined by source and drain regions.

Referring to FIG. 1, there is shown a single transistor non-volatile electrically alterable semiconductor memory cell 10. The cell 10 comprises a semiconductor substrate 12, such as silicon. The substrate 12, in one embodiment, can be a P-type silicon substrate with a typical resistivity from 5 to 50 ohm-cm, depending on the level of scaling.

Within the substrate 12 are defined source region 16 and drain region 14 with a channel region 18 therebetween. Disposed over the source region 16, channel region 18, and drain region 14 is a first layer 20 of insulating material, on the order of between about 70–200 Angstroms of thickness. The first layer 20 can be an insulating material made from silicon dioxide, silicon nitride or silicon oxynitride. Disposed over the first layer 20 is a floating gate 22. The floating gate 22 is positioned over a portion of the channel region 18 and over a portion of the drain region 14. The floating gate 22 can be a polysilicon gate or a re-crystallized polysilicon gate. A second insulating layer 25 has a first portion 24 disposed over the floating gate 22 and a second portion 26 disposed adjacent to the floating gate 22. The first portion 24 (top wall 24) of the second layer 25 is an insulating material and can be silicon dioxide, silicon nitride or silicon oxynitride and is on the order of between about 1000–3000 Angstroms in thickness. The second portion of the second layer 25 is also of an insulating material and can be silicon dioxide, silicon nitride or silicon oxynitride and is on the order of 150–2000 angstrom in thickness. A control gate 29 has two portions: A first portion 28 is disposed over the top wall 24 of the second layer 25; a second portion 30 is disposed over the first layer 20 and is immediately adjacent to the side wall 26 of the second layer 25. The second portion 30 of the control gate 29 extends over a portion of the source region 16 and over a portion of the channel region 18.

In general, the dimensions of the cell 10 must be such that electrons emanating from the source region 16 are injected onto the floating gate 22 by sensing the abrupt potential drop. Further, the dimensions of cell 10 must be such that charges from the floating gate 22 are removed by tunneling through the Fowler-Nordheim mechanism through the second layer 25 onto the control gate 29. The particular manner of operating the cell 10 is as follows:

Initially, when it is desired to erase cell 10, a ground potential is applied to the drain 14 and to the source 16. A high-positive voltage, on the order of +15 volts, is applied to the control gate 29. Charges on the floating gate 22 are induced through the Fowler-Nordheim tunneling mechanism to tunnel through the second layer 25 to the control gate 29, leaving the floating gate 22 positively charged.

When selective cells 10 are desired to be programed, a ground potential is applied to the source region 16. A positive voltage level in the vicinity of the threshold voltage of the MOS structure defined by the control gate 29, (on the order of approximately of +1 volt), is applied to the control gate 29. A positive high voltage, on the order of +12 volts, is applied to the drain region 14. Electrons generated by the source region 16 will flow from the source region 16 towards the drain region 14 through a weakly-inverted channel region 18. When the electrons reach the region where the control gate 29 meets the side wall 26, the electrons see a steep potential drop approximately equal to the drain voltage, across the surface region defined by the gap of the side wall 26. The electrons will accelerate and become heated and some of them will be injected into and through the first insulating layer 20 onto the floating gate 22.

The injection of electrons onto the floating gate 22 will continue until the charged floating gate 22 can no longer sustain a high surface potential beneath, to generate hot electrons. At that point, the electrons or the negative charges in the floating gate 22 will "turn off" the electrons from flowing from the source region 16 onto the floating gate 22.

Finally, in a read cycle, ground potential is applied to the source region 16. Conventional transistor read voltage, such as +2 volts and +5 volts, are applied to the drain region 14 and to the control gate 29, respectively. If the floating gate 22 is positively charged (i.e., the floating gate is discharged), then the channel region 18 directly beneath the floating gate 22 is turned on. When the control gate 29 is raised to the read potential, the region of the channel region 18 directly beneath the second portion 30 is also turned on, causing electrical current to flow from the drain region 14 to the source region 16. This would be the "1" state.

On the other hand, if the floating gate 22 is negatively charged, the channel region 18 directly beneath the floating gate 22 is either weakly turned on or is entirely shut off. Even when the control gate 29 and the drain region 14 are raised to the read potential, little or no current will flow through the portion of the channel region 18 directly beneath the floating gate 22. In this case, either the current is very small compared to that of the "1" state or there is no current at all. In this manner, the cell 10 is sensed to be programed at the "0" state.

Referring to FIG. 2, there is shown a memory device 40. The memory device 40 has an array 50 of memory cells. The peripheral circuitry on the device 40 includes conventional row address decoding circuitry 52, column address decoding circuitry 42, sense amplifier circuitry 44, output buffer circuitry 46 and input buffer circuitry 48. These conventional circuits correspond to the peripheral devices of the prior art.

The interconnection of the source, drain and gate of each of the cell 10 to the memory array 50 is as follows: All of the source 16 of each of the memory cell 10 are connected to the other through a common source line. The drain 14 of each of the cell 10 in the same column are connected together. Thus, column 18a has connected thereto the drain from each of the cell 10 in the leftmost column. The plurality of columns 18(a . . . z) are connected to the column address decode 42. The gate 28 of each of the memory cells 10 in the same row are connected together. Thus, the row signal line 62a connects to the gate 28 of each of the memory cells 10 in the uppermost row. The plurality of rows 62(a . . . z) are supplied to the row address decode 52.

In the operation of the memory array 50, in the event erased mode is desired, the plurality of column address lines 18(a . . . z) are all brought to a ground potential. The common source line 16 is also brought to a ground potential. The plurality of row address lines 62(a . . . z) are all brought to a high positive potential, such as +15 volts. In this manner, all of the memory cells 10 in the memory array 50 are erased. When only a selected row of the memory array 50 is to be erased, the particular row address line, e.g., 62m, is raised to a high positive potential, such as +15 volts with the rest of the row addresses at ground potential. In this manner only the memory cells in row 62m are erased.

Thereafter, for selective programming of selected memory cells 10, programming is accomplished as follows: The common source line 16 is again brought to ground potential. The particular row address line 62m, which is connected to the gate 28 of the particular memory cell 10 to be programed is brought to a +1 volt. The unselected row address lines 62(a . . . l,n . . . z) are brought to a ground potential. The column address line 18m of the particular memory cell 10 selected is brought to a high positive potential, such as +12 volts. The unselected column lines 18(a . . . l,n . . . z) are brought to a ground potential.

The voltage supplied to the various contacts of the selected memory cell 10 are as follows: Drain 14 is brought to a +12 volts, source 16 is brought to a ground potential, and gate 28 is brought to +1 volt. This causes programming of the selected memory cell 10, as previously discussed.

The voltage supplied to the unselected memory cell 10 can have the following possible voltage potentials supplied thereto: For all of the memory cells 10 in the selected row 62m, the source 16 is at ground potential, the drain 14 is at ground potential, and the gate is at +1 volt. In this condition, since the drain 14 is at the same potential as the potential of the source 16, electrons will not migrate from the source 16 through the channel region 18, beneath the control gate 29, onto the floating gate 22.

For all the memory cells in the same column 18m as the selected memory cells 10, the voltage potential applied to the various regions are as follows: Source 16 is at ground potential, drain 14 is at +12 volts, the control gate 28 is at ground potential. In this configuration, although the drain 14 is at a higher positive potential than the source 16, there is no induced channel beneath the control gate 28. Thus, there is no flow of electrons from the source 16 to the control gate 28 and through the first insulating layer 20 to the floating gate 22.

Finally, with respect to the memory cells that are not in the same row 62m or in the same column 18m as the selected memory cell 10, the voltage potential applied to the various regions of the memory cell 10 are as follows: Ground potential to the source 16, ground potential to the gate 28 and ground potential to the drain 14. In this configuration, or course, no electron flow occurs at all.

Finally, when a read operation is desired, the common source line 16 is brought to a ground potential. The selected column address line 18m, supplied to the selected memory cell 10, is brought to a +2 volts. The selected row address line 62m, connected to the selected memory cell 10, is brought to a +5 volts. The selected memory cell 10 can thus be read out.

A critical aspect of the aforedescribed memory device is the integrity of the layer 26 over the floating gate 22 of device 10.

SUMMARY OF THE INVENTION

An object of this invention is to provide an improved dual tunneling insulating layer between the floating gate and control gate of a single transistor memory device.

Another object of this invention is to provide an improved method of fabricating single transistor memory devices, wherein the tunneling insulator layer over the floating gate is formed by forming a silicon oxide layer followed by forming an inner silicon oxynitride layer with $N_2O$.

Yet another object of the invention is to provide an improved method for forming a tunnel insulator structure that has fewer manufacturing steps and does not have the severe prior art problem of pin holes in the tunneling structure which cause device failures.

In accordance with the present disclosure an improved electrically programmable and erasable memory device with a single transistor cell is disclosed. The memory device, with a plurality of raw address lines, a plurality of column address lines, and a common line are supplied to a plurality of storage sites. At each storage site is provided a single transistor with spaced source and drain regions, a floating gate over a portion of the channel, and a control gate over the remaining portion of the channel. The improvement is a dual tunnel insulator layer over the floating gate consisting of a silicon oxide layer with an inner interface silicon oxynitride layer.

The method of the invention for forming an improved electrically programmable and erasable memory device The method of the invention or forming an improved electrically programmable and erasable non-volatile memory device having a plurality of addressable single transistor cells, each transistor having spaced source and drain regions, a floating gate and a control gate, included a technique for forming a new and improved tunneling insulator layer structure between the floating gate and control gate. In the method a polycrystalline silicon floating gate is formed, by forming a layer of $SiO_2$ over the gate by oxidizing the silicon material, exposing the floating gate to $N_2O$ at an elevated temperature to form an inner silicon oxynitride layer between the silicon oxide layer and the floating gate. Preferably the gate structure is heated in an oxidizing atmosphere to heal any potential pin holes.

DESCRIPTION OF THE PREFERRED EMBODIMENTS

Figure 1:
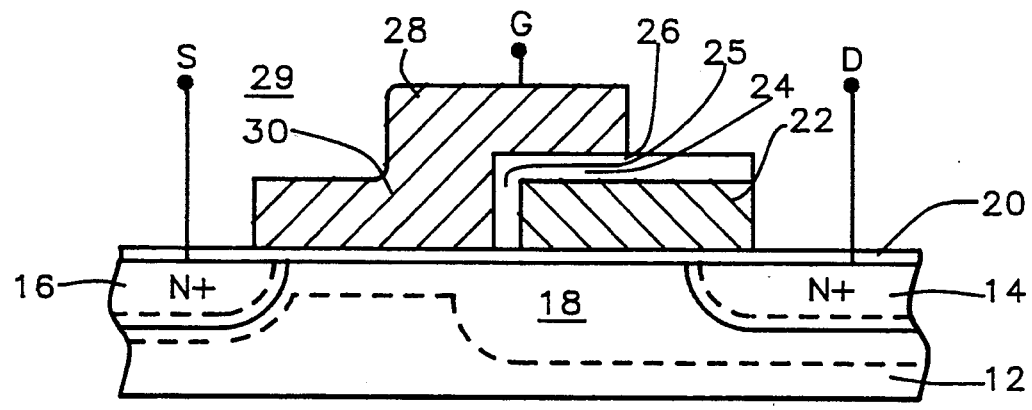
FIG. 1 is a cross sectional side view of a single transistor non-volatile electrically alterable memory cell, as known to the prior art.
Figure 2:
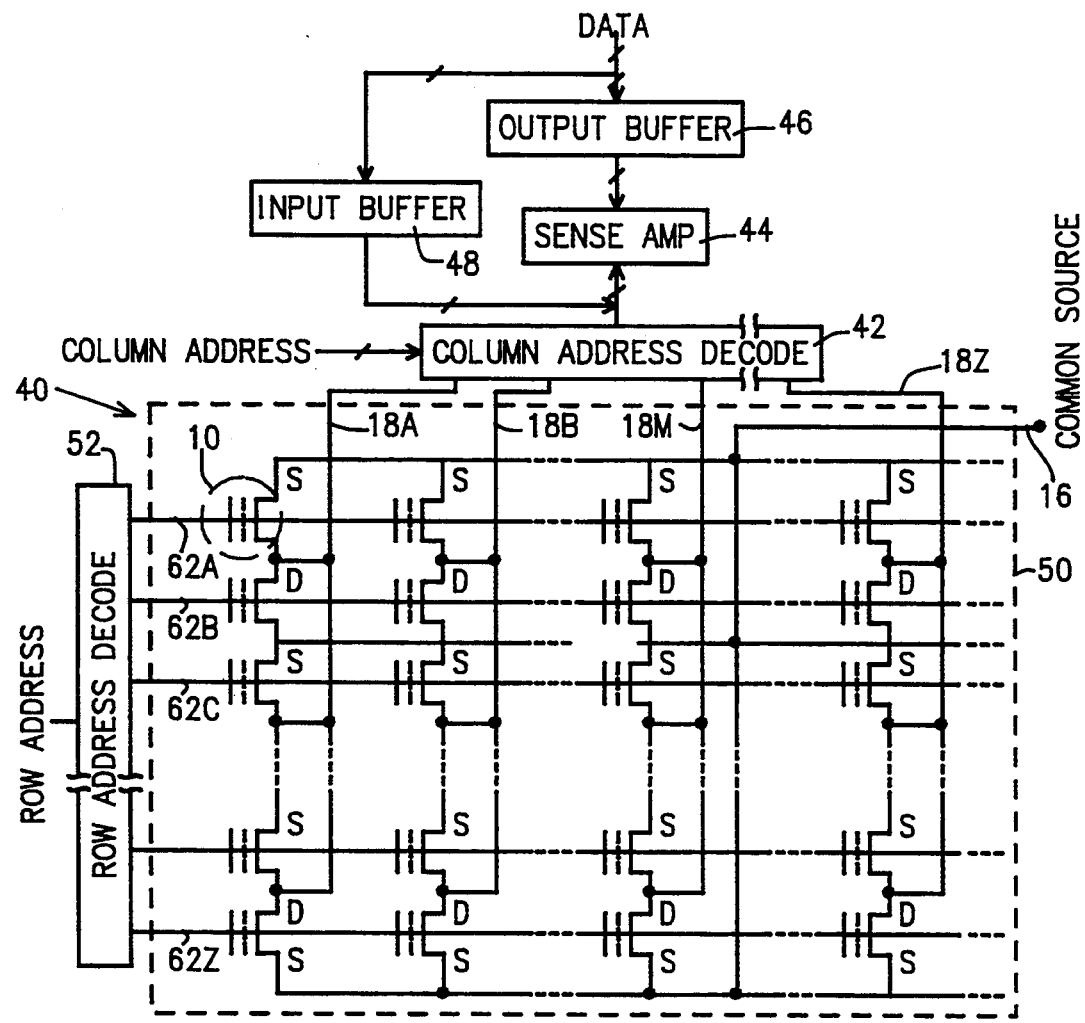
FIG. 2 is a schematic diagram of a memory device using an array of memory cells as shown in FIG. 1, as known to the prior art.
Figure 3:
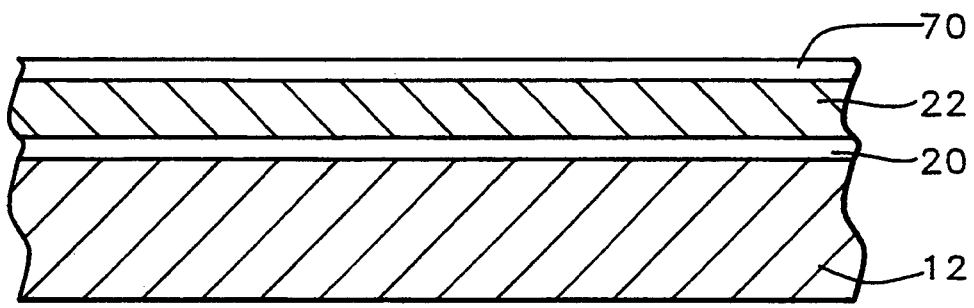
FIG. 3 through FIG. 8 is a sequence of cross sectional views, in broken section, that illustrate the novel steps of applicants improved process for forming a dual layer tunneling insulator structure.
Figure 4:
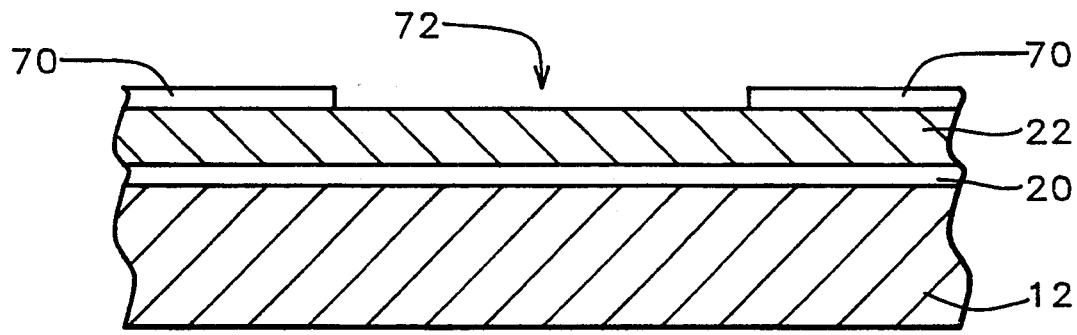
Figure 5:
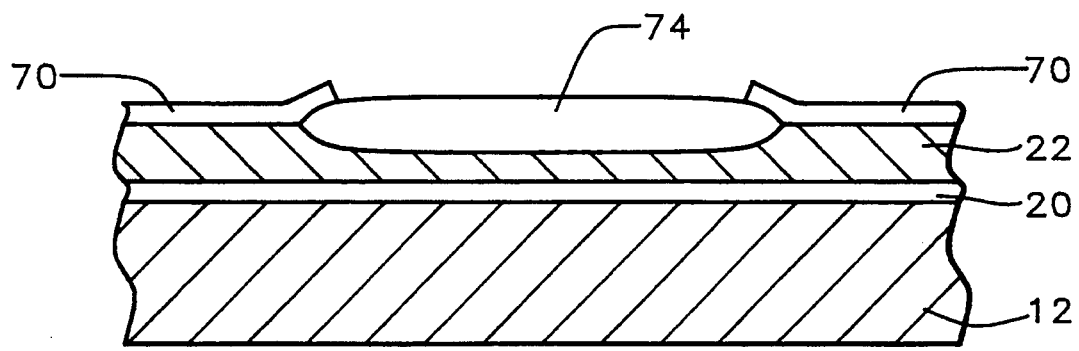
Figure 6:
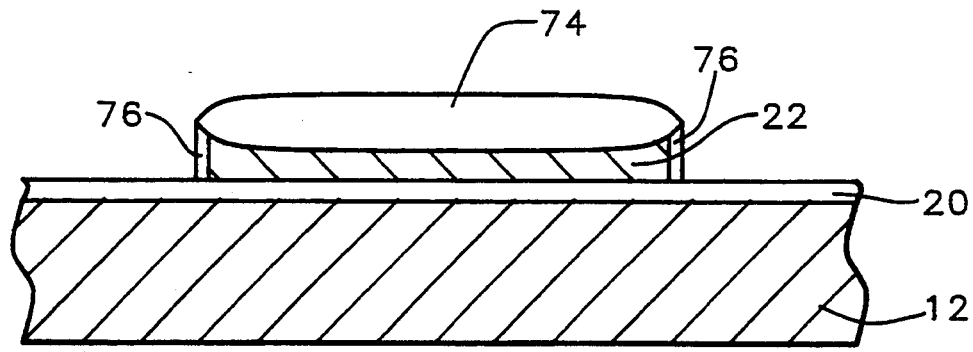
Figure 7:
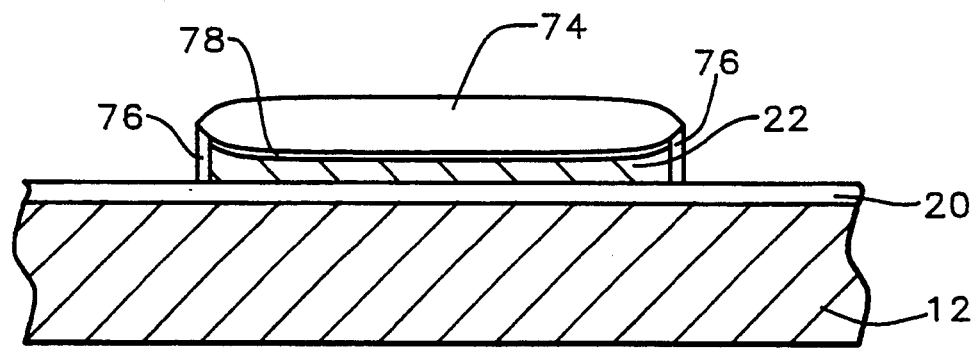

Referring now to FIG. 3 through FIG. 8, there is illustrated a preferred specific embodiment of applicants method of forming an improved tunneling insulator structure. A first insulating layer 20, or gate oxide layer, is grown on substrate 12. The layer 20 is preferably formed by thermal oxidation at a temperature of between about 875° to 950° C. in an oxygen atmosphere. The layer 20 preferably has a thickness in the range of between about 100 to 200 Angstroms. Thereafter a layer 22 of polysilicon, or amorphous silicon, is deposited over the insulating layer 20 using well known deposition techniques. The thickness of layer 22 is preferably in the range of between about 1000 to 2300 Angstroms. The polysilicon layer 22 is capped with a silicon nitride layer 70 using will known deposition techniques. The structure shown in FIG. 3 can be subjected to a long term thermal cycle, i.e., 1100°–1200° C. for a time in the range of about 60 to 100 minutes. The thermal cycle results in increasing the size of the silicon crystals in layer 22. layer 70 which will subsequently define the floating gate. As shown in FIG. 5, the exposed polycrystalline layer 22 is then oxidized to form oxide layer 74. The oxidation of layer 22 can be accomplished by heating the device to a temperature in the range of between about 850° to 1000° C. in a oxidizing atmosphere of nitrogen/oxygen/steam for a time in the range of 40 to 100 minutes. This will result in a oxide thickness of layer 74 in the range of between about 2000 to 3000 Angstroms. The layer 70 is etched away. The portions of layer 22 are then removed that are not covered by layer 74 leaving the structure shown in FIG. 6. The uncovered portions of layer 22 can be conveniently removed by, for example dry $SF_6$ etching. The exposed edge portions of layer 22 are then oxidized at a slow rate to form layer 76, as shown in FIG. 6. Layer 76 is formed by thermal oxygen oxidation at 850° to 950° C. for 3 to 5 minutes in an atmosphere of oxygen/steam. This will result in a silicon oxide film having a thickness in the range of between about 100 to 150 Angstroms. Subsequently, an inner interface layer of silicon oxynitride is formed over the layer 22, now a floating gate, by exposing the device to $N_2O$ at a temperature in the range of between about 950° to 1050° C., for a time in the range of between about 15 to 30 minutes. During this step, $N_2O$ will diffuse through the silicon oxide layer 76 and the range of 15 to 30 minutes form a thin silicon oxynitride layer 78 at the interface of the layer 22 and layer 74 and 76. Layer 78 is formed of $SiN_xO_y$, where x is in the range of 1 to 2, and y is in the range of 2 to 3. The layer 78 has a thickness in the range of between about 50 to 100 Angstroms. The resultant dual layer should be oxidized to heal any pin holes in the layers surrounding the floating gates. The dual layer provides an excellent tunneling insulator structure because $SiN_xO_y$ is a much better dielectric than just silicon oxide.

Figure 8:
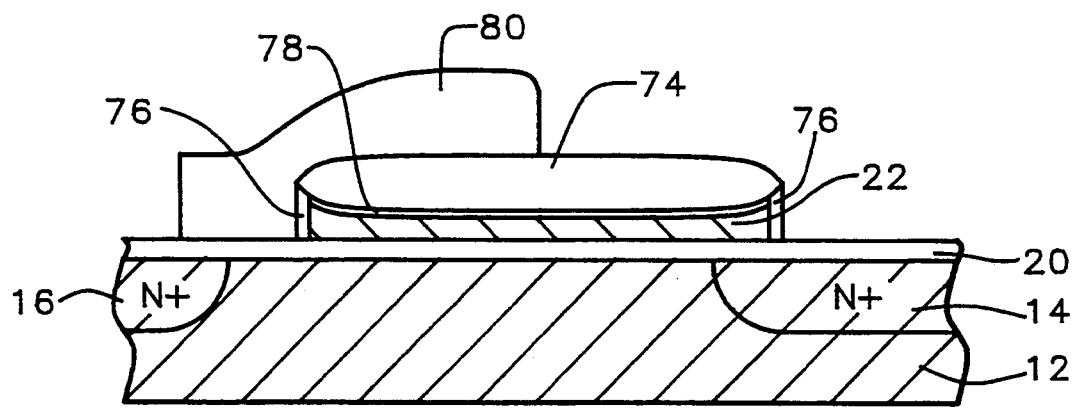

The remaining steps for completing the memory device are well known and do not per se constitute part of the invention. As shown in FIG. 8, source 16 and drain 14 regions are formed and a control gate 80 of polycrystalline silicon are formed. Additional steps, not shown, are performed to complete the device.

While the invention has been particularly shown and described with reference to the preferred embodiments thereof, it will be understood by those skilled in the art that various changes in form and details may be made without departing from the spirit and scope of the invention.

What is claimed is:

1. A method of forming an improved electrically programmable and erasable memory device on a semiconductor substrate having a plurality of storage sites, a plurality of row address lines, a plurality of column address lines, and a common line, wherein each combination of one of the plurality of row address lines and one of the plurality of column address lines define a different one of the plurality of storage sites, and further wherein each of the plurality of storage sites comprises a single transistor having a source coupled to the common line, a drain coupled to an associated one of the plurality of column address lines, a control gate coupled to an associated one of the plurality of row address lines, the source and drain defining a channel region, a polycrystalline silicon floating gate located over a portion of the channel and a portion of the drain, said control gate located over a portion of the channel not occupied by the floating gate, and over a portion of the source, a gate insulating layer over said source, drain and channel region, and a tunneling insulator layer between said floating gate and said control gate, the improvement comprising forming said tunneling insulator layer by forming a polycrystalline silicon floating gate on the semiconductor substrate over said gate insulating layer, forming an $SiO_2$, tunneling layer over said polycrystalline silicon floating gate by oxidizing said gate by wet oxidation;

forming an interface $SiN_xO_y$ layer between said floating gate and said $SiO_2$ tunneling layer by exposing the floating gate with said $SiO_2$ layer to $N_2O$ at a temperature, where x is in the range of about one (1) to two (2) and y is in the range of about two (2) to three (3) and forming a control gate over said $SiO_2$ tunneling layer with an insulating layer formed over control gate.

2. The method of claim 1 wherein said $SiO_2$ tunneling layer is formed by heating said floating gate to a temperature in the range of 850° to 950° C. in an environment of nitrogen, oxygen, and water.

3. The method of claim 2 wherein the thickness of the $SiO_2$ layer is between about 100 to 150 Angstroms.

4. The method of claim 1 wherein said interface $SiN_xO_y$ layer is formed by exposing said floating gate and said $SiO_2$ to a temperature in the range of between about 950° to 1050° C. in an environment of $N_2O$ for a time of about 15 to 30 minutes.

5. The method of claim 4 wherein the thickness of the interface layer is about 50 to 100 Angstroms.

6. The method of claim 4 wherein the temperature is about 950° to 1000° C. and the exposure time to the $N_2O$ environment was more than about 20 minutes.

7. The method of claim 5 wherein the thickness of the interface layer is less than about 70 Angstroms.

8. The method of claim 1 wherein the resultant tunneling insulator layer and interface layer are subjected to a final oxidation step to heal potential pin holes.

* * * * *